(12) United States Patent
Miyagawa et al.

(10) Patent No.: US 9,499,740 B2
(45) Date of Patent: Nov. 22, 2016

(54) LIGHT EXTRACTION ELEMENT

(71) Applicant: Nitto Denko Corporation, Osaka (JP)

(72) Inventors: Hiroaki Miyagawa, Oceanside, CA (US); Bin Zhang, San Diego, CA (US)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/548,149

(22) Filed: Nov. 19, 2014

(65) Prior Publication Data
US 2015/0144978 A1    May 28, 2015

Related U.S. Application Data

(60) Provisional application No. 61/907,972, filed on Nov. 22, 2013.

(51) Int. Cl.
*H01L 33/50* (2010.01)
*C09K 11/77* (2006.01)
*C09K 11/02* (2006.01)
(Continued)

(52) U.S. Cl.
CPC .......... *C09K 11/7774* (2013.01); *B32B 18/00* (2013.01); *C04B 35/44* (2013.01); *C04B 35/6261* (2013.01); *C04B 35/634* (2013.01); *C04B 35/638* (2013.01); *C04B 38/067* (2013.01); *C09K 11/02* (2013.01); *H01L 33/502* (2013.01); *H01L 33/505* (2013.01); *H01L 33/507* (2013.01); *C04B 2111/80* (2013.01); *C04B 2235/3208* (2013.01); *C04B 2235/3217* (2013.01); *C04B 2235/3224* (2013.01); *C04B 2235/3225* (2013.01); *C04B 2235/3229* (2013.01); *C04B 2235/5409* (2013.01); *C04B 2235/6025* (2013.01); *C04B 2235/6562* (2013.01); *C04B 2235/6565* (2013.01); *C04B 2235/6582* (2013.01); *C04B 2235/663* (2013.01); *C04B 2235/764* (2013.01);
(Continued)

(58) Field of Classification Search
CPC ............................. H01L 33/60; H01L 33/20
USPC ......................................................... 257/98
See application file for complete search history.

(56) References Cited

U.S. PATENT DOCUMENTS 5,998,925 A  12/1999 Shimizu et al.
6,069,440 A   5/2000 Shimizu et al.
(Continued)

FOREIGN PATENT DOCUMENTS

WO   WO 2006/126119   11/2006
WO   WO 2009/090580    7/2009
WO   WO 2010/010484    1/2010

OTHER PUBLICATIONS

ISR and Written Opinion for PCT/US2014/066439; international filing date: Nov. 19, 2014, ISR mail date: Feb. 27, 2015.

*Primary Examiner* — Fernando L Toledo
*Assistant Examiner* — Neil Prasad
(74) *Attorney, Agent, or Firm* — K&L Gates LLP; Brent A. Johnson; Louis C. Cullman

(57) ABSTRACT

Described herein are elements for light emitting devices comprising: an emissive element comprising a host material and an emissive guest material and substantially free of light scattering material; and a light scattering element comprising either a non-emissive or an emissive material, wherein the light scattering element is between about 2.5% to about 60% by volume voids and the thickness ratio of light scattering element to the emissive element is at least 1 to about 2.

13 Claims, 4 Drawing Sheets

(51) Int. Cl.
  *C04B 38/06* (2006.01)
  *B32B 18/00* (2006.01)
  *C04B 35/44* (2006.01)
  *C04B 35/626* (2006.01)
  *C04B 35/634* (2006.01)
  *C04B 35/638* (2006.01)
  *H01L 51/52* (2006.01)
  *C04B 111/80* (2006.01)

(52) U.S. Cl.
  CPC ......... *C04B 2235/9646* (2013.01); *C04B 2235/9661* (2013.01); *C04B 2237/34* (2013.01); *C04B 2237/341* (2013.01); *C04B 2237/343* (2013.01); *C04B 2237/704* (2013.01); *H01L 51/5268* (2013.01); *H01L 2933/0041* (2013.01); *H01L 2933/0091* (2013.01)

(56) References Cited

U.S. PATENT DOCUMENTS

| | | | |
|---|---|---|---|
| 7,514,721 | B2 | 4/2009 | Krames et al. |
| 7,521,862 | B2* | 4/2009 | Mueller ............... C04B 35/584 313/506 |
| 7,799,267 | B2 | 9/2010 | Messing et al. |
| 8,283,843 | B2 | 10/2012 | Pan et al. |
| 8,829,779 | B2 | 9/2014 | Schmidt et al. |
| 2011/0227477 | A1 | 9/2011 | Zhang |
| 2011/0309398 | A1* | 12/2011 | Ito et al. .................. 257/98 |
| 2012/0161162 | A1 | 6/2012 | Engl |
| 2013/0114269 | A1* | 5/2013 | Domercq et al. ........ 362/311.05 |
| 2014/0159090 | A1* | 6/2014 | Huang .................. H01L 33/02 257/98 |

\* cited by examiner

LIGHT EXTRACTION ELEMENT

BACKGROUND

1. Field

Some embodiments are related to light emitting devices. Some embodiments are related to elements for enhancing light extraction from light emitting.

2. Description of the Related Art

Solid state light emitting devices such as light emitting diode (LED), organic light emitting diode (OLED) or sometimes called organic electroluminescent device (OEL), and inorganic electroluminescent device (IEL) have been widely utilized for various application such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Conventional white-LED have been manufactured based on the combination of blue-LED and yellow light-emitting YAG phosphor powder dispersed in plastic encapsulant resin like epoxy and silicone as disclosed in U.S. Pat. No. 5,998, 925 and U.S. Pat. No. 6,069,440. However, since the particle size of YAG phosphor powder utilized for this system is around 1-10 µm, the YAG powders dispersed in the encapsulant resin medium can cause strong light scattering. Consequently, a considerable portion of both the incident light from the blue LED and the yellow emitting light from YAG powders ends up being back scattered and dissipated as a loss of white light emission.

One response to this problem is to form a monolithic ceramic member of wavelength converting material. The ceramic member can be plural ceramic layers of single or multiple phosphors, or transparent layers. The transparent ceramic layers may be, for example, the same host material as the activating dopant. (U.S. Pat. No. 7,361,938). These laminated layers may also be in the form of luminescent ceramic cast tapes, which can be laminated and co-fired with the host material. (U.S. Pat. No. 7,514,721 and US Published Application 2009/0108507).

For phosphor ceramic, ultrahigh purity of the host material is desired to provide high wavelength conversion efficiency. Such phosphor ceramics can be processed through solid-state reaction. Transparent phosphor ceramic plate can be applied to obtain white LED with combining with blue LED. However, transparent phosphor ceramic plate contains emitted yellow light within the ceramic plate, due to high refractive index (~1.83). As a result, the efficacy of the white LED cannot be maximized without better light out-coupling. Thus there is a need for a ceramic element that improves the light out-coupling leading to higher efficacy of white LED device.

SUMMARY

The present embodiments relate to an element useful for enhancing light extraction from light emitting devices.

In some embodiments, a light emitting element is described, comprising: an emissive element comprising a host material and an emissive guest material, wherein the emissive element can be substantially free of light scattering material; and a light scattering element comprising either a non-emissive or an emissive material, wherein the light scattering element is between about 2.5 vol. % to about 60 vol. % by volume voids. In some embodiments the thickness ratio of light scattering element to the emissive element is greater than about 1:2. In some embodiments the thickness ratio of light scattering element to the emissive element is less than about 1:2. In some embodiments the thickness ratio of light scattering element to the emissive element is from about 0.1 to about 0.5, from about 0.2 to about 0.3, about 0.24 or about 0.29, or any ratio bounded by or between any of these values. In some embodiments, the emissive element and the light scattering element have substantially the same refractive index. In some embodiments, the emissive element and the light scattering element comprise the same material. In some embodiments, the light scattering element comprises a substantially large difference refractive index material. In some embodiments, the first emissive element is less than about 200 µm thick. In some embodiments, the host material comprises a garnet host material. In some embodiments, the garnet host material comprises $Y_3Al_5O_{12}$, $Lu_3Al_5O_{12}$, $Ca_3Sc_2Si_3O_{12}$, $(Y,Tb)_3Al_5O_{12}$ and $(Lu, Y, Gd)_3(Al, Ga)_5O_{12}$, $Lu_2CaSi_3Mg_2O_{12}$, $Lu_2CaAl_4SiO_{12}$. In some embodiments, the garnet host material can be YAG. In some embodiments, the emissive guest material can be Ce, Mn, Nd, Er, Eu, Cr, Yb, Sm, Tb, Gd, and Pr. In some embodiments, the emissive guest material can be Ce.

In some embodiments, a semiconductor light emitting device is described comprising: a light emitting source providing an emitted radiation; and a light emitting element described above, wherein the light emitting element is positioned to receive the radiation emitted from the light emitting source In some embodiments a method of making the ceramic light extraction element is described, comprising providing an emissive element substantially free of light scattering material; and providing a light scattering element defining 2.5 vol. % to about 60 vol. % voids therein, the light scattering element less than a half as thick of the emissive element. In some embodiments, the method comprises concurrently sintering the emissive element and the light scattering element. In some embodiments, providing the light scattering element comprises forming a scattering element from a slurry comprising ceramic precursor materials and void creating materials, wherein the void creating material comprise about 2.5 vol. % to about 60 vol. % of the slurry. In some embodiments, the emissive element and the light scattering element are substantially concurrently sintered.

These and other embodiments are described in greater detail below.

DETAILED DESCRIPTION

Embodiments of the light emitting element can increase device efficiency. In an embodiment, the light emitting element enhances the light extraction from the device.

Figure 1A:
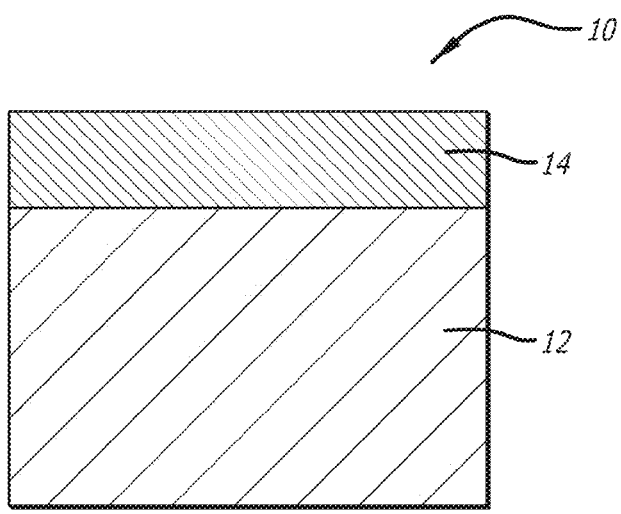
FIG. 1A is a schematic depiction of an embodiment of a ceramic light extraction element.
Figure 1B:
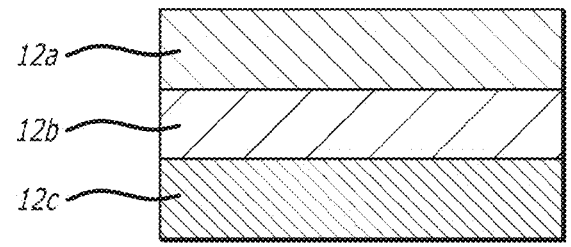
FIG. 1B is a schematic depiction of an embodiment of a ceramic element without a light extraction element.

In some embodiments, as shown in FIG. 1, a ceramic wavelength converting element 10 is described, comprising an emissive element 12 comprising a host material and an emissive guest material and substantially free of light scattering material; and a light scattering element 14 comprising either a non-emissive or an emissive material, wherein the light scattering element is between about 2.5% to about 60% by volume voids. In some embodiments the thickness ratio of light scattering element to the emissive element is at least about 1:2. In some embodiments the thickness ratio of light scattering element to the emissive element is less than about 1:2. In some embodiments, the emissive element has a transparency of at least about 70%, at least about 75%, at least about 80% total transparency therethrough. For example, emissive layer transparency of YAG without light scattering material can be about 86%. In some embodiments, the emissive element can comprise plural emissive layers. In some embodiments, the light scattering element can comprise plural light scattering layers.

In some embodiments, the emissive element 12 comprises a host material. In some embodiments, the host material can be a phosphor. The types of phosphors for the emissive phase of the sintered ceramic plate are chosen to achieve the desired white point (i.e., color temperature) by taking the absorption and emission spectra of different types of phosphors into consideration. In some embodiments, the emissive element comprises a garnet material. The garnet may have a composition $A_3B_5O_{12}$, wherein A and B are independently selected from trivalent metals. In some embodiments, A can be selected from the following elements: Y, Lu, Ca, Gd, La, and Tb; B can be selected from the following elements: Al, Mg, Si, Ga, and In.

In some embodiments, the emissive element 12 includes a garnet host material and an emissive guest material. In some embodiments, the emissive guest material is at least one rare earth metal. In some embodiments, the rare earth metal is selected from the group consisting of Ce, Nd, Er, Eu, Mn, Cr, Yb, Sm, Tb, Gd, and Pr. In some embodiments, the guest material is at least Ce. In some embodiments, the guest material can be Ce and Gd. In some embodiments, the guest material further includes an emissive material selected from Mn, Nd, Er, Eu, Cr, Yb, Sm, Tb, Gd, and Pr. Examples of useful phosphors include $Y_3Al_5O_{12}$:Ce, $Lu_3Al_5O_{12}$, $Ca_3Sc_2Si_3O_{12}$, $Lu_2CaSi_3Mg_2O_{12}$, $Lu_2CaAl_4SiO_{12}$, $(Y, Tb)_3Al_5O_{12}$:Ce, $(Lu, Y, Gd)_3(Al, Ga)_5O_{12}$:Ce. In one embodiment, the phosphor material comprises $Y_3Al_5O_{12}$:$Ce^{3+}$ (YAG:Ce) synthesized by solid state reaction. In one embodiment, the phosphor material comprises $Lu_3Al_5O_{12}$:$Ce^{3+}$ (LuAG:Ce) synthesized by solid state reaction.

In one embodiment, the emissive element 12 comprises an emissive guest material at a concentration of between 0.01% to about 20.0% by mol. In another embodiment, the emissive element comprises an emissive guest material concentration of between 0.02% to about 2.0% by mol. In another embodiment, the emissive element comprises an emissive guest material concentration of between 0.05% to about 1.0% by mol. In another embodiment, the emissive element comprises a dopant concentration of between 0.1% to about 0.6%, including, but not limited to, 0.15% or 0.50%. In some embodiments, the Ce emissive guest concentration can be between 0.1% to about 0.50% and the Gd emissive guest concentration can be about 2.5% to about 50.0%, e.g., about 10%. In some embodiments, the emissive element is less than about 200 μm, about 500 μm, about 1000 μm, about 2500 μm, about 5000 μm, about 7500 μm, and/or about 10000 μm thick. In some embodiments, the emissive element comprises plural layers, the plural layers having a total thickness of the aforementioned values.

In some embodiments, the emissive element 12 can be substantially free of light scattering material. In some embodiments, the emissive element comprises less than about 10 vol %, less than about 7 vol %, less than about 5 vol %, less than about 3 vol %, less than about 1 vol %, less than about 0.5 vol % light scattering material.

In some embodiments, the emissive element and the light scattering element can independently be singular and/or plural layers. In some embodiments, the light emitted from the emissive layer passes through the light scattering layer prior to leaving the device. In some embodiments, the light scattering layer can be above the emissive element. In some embodiments, a light scattering layer can be disposed upon the emissive layer. In some embodiments, a light scattering layer can be disposed between plural emissive layers. In some embodiments, a light scattering layer can be distal the light emitting source relative an emissive layer. In some embodiments, a light scattering layer can be proximal the light emitting source relative the emissive layer.

In some embodiments, the light scattering element 14 can be comprise a matrix material and a low refractive index material. In some embodiments, the matrix material can comprise an emissive material (e.g., a host and an emissive guest material) and/or a non-emissive material (e.g., host material alone). In some embodiments, the low refractive index material can have a refractive index of at least 0.3, 0.4, 0.5, 0.75, 1.0, 1.5 refractive index less than the light scattering element matrix material, and/or the emissive element material. In some embodiments, the low refractive index material can have a refractive index of less than about 1.3, less than about 1.2, less than about 1.1 and/or less than about 1.05. Thus, for example, the refractive index of YAG, an example of a matrix material, can be about 1.83 and the refractive index of air or pores defined in YAG can be about 1.00, a difference in refractive index of about 0.83. In some embodiments, the light scattering matrix material can be any of the host materials described earlier. In some embodiments, the low refractive index material can be, but not limited to, carbon dioxide, carbon monoxide, air, nitrogen, argon, hydrogen, helium and/or combinations or mixtures thereof. In some embodiments, low refractive index material can be voids and/or pores defined in the matrix material. In some embodiments, the voids are resulting from the removal of the polymeric beads during debinding and/or sintering.

In some embodiments, the light scattering element 14 can comprise a matrix material defining voids therein. In some embodiments, the voids can be pores defined within the matrix material. In some embodiments, the matrix defines voids having at least or greater than about 10%, than about 11%, than about 12%, than about 13%, than about 14%, and/or than about 15% of the total volume. In some embodiments, the light scattering element is between about 5%, about 7%, about 10%, about 11% to about 15%, about 17%, about 20% and/or any combination of the aforedescribed bottom values and top values. In some embodiments, the light scattering element is between about 2.5%, 5%, about 7%, about 10% to about 20%, to about 30%, to about 50%, to about 60% and/or any combination of the aforedescribed bottom values and top values void volume %.

In some embodiments, the light scattering layer is between about 5 nm, about 10 nm, about 500 nm, about 1

μm, about 5 μm, about 10 μm to about 30 μm, about 50 μm, about 100 μm, about 250 μm thick and/or any combination of the aforedescribed bottom values and top values.

In some embodiments, the emissive element 12 and the light scattering element 14 can comprise material having substantially the same refractive index. In some embodiments, the emissive element 12 and the light scattering element 14 comprise material having a refractive index within at least 0.001, 0.01, 0.025, 0.05, 0.1, 0.3, 0.4, 0.5, 0.75, 1.0 of each other.

In some embodiments, the emissive element and the light scattering element comprise at least 50%, at least 60% at least 70%, at least 80% at least 90% of the same material. In some embodiments, the emissive element and the light scattering element comprise substantially the same material. In some embodiments, the emissive element and the light scattering element comprise substantially the same host material. In some embodiments, the emissive element and the light scattering element comprise plural phases of the same host material. In some embodiments, the same host material can be $Y_3Al_5O_{12}$ (YAG). In some embodiments, the same host material can be $Lu_3Al_5O_{12}$ (LuAG). In some embodiments, the plural phase can be $Y_3Al_5O_{12}$, $Lu_3Al_5O_{12}$, $Y_2O_3$, $Al_2O_3$, $YAlO_3$ (Yttrium Aluminum Perovskite or YAP) and $Y_4Al_{12}O_9$ (Yttrium Aluminum Monoclinic or YAM), or any combinations or mixtures thereof.

In some embodiments, the emissive and the light scattering elements comprise materials substantially sintered in the same manner as the garnet material of the emissive element. In some embodiments, the garnet host material is selected from: $Y_3Al_5O_{12}$, $Lu_3Al_5O_{12}$, $Ca_3Sc_2Si_3O_{12}$, $(Y,Tb)_3Al_5O_{12}$ and $(Lu, Y, Gd)_3(Al, Ga)_5O_{12}$, $Lu_2CaSi_3Mg_2O_{12}$, $Lu_2CaAl_4SiO_{12}$. In some embodiments, the emissive guest material at least comprises Ce. In some embodiments, the light emitting element further comprises an emissive guest materials selected from the group consisting of Mn, Nd, Er, Eu, Cr, Yb, Sm, Tb, Gd, and Pr.

In some embodiments, the thickness ratio of light scattering element to the emissive element can be at least about 1 to about 2 (light scattering element about 50% as thick as the emissive element), at least about 1 to about 3 (light scattering element about 33% as thick as the emissive element), at least 1 to about 4 (about 25% as thick), at least 1 to about 5 (about 20% as thick), at least 1 to about 6 (about 16% as thick), at least 1 to about 7 (about 14% as thick), at least 1 to about 8 (about 12.5% as thick), at least about 1 to about 10 (about 10% as thick), at least about 1 to about 15 (about 7% as thick), at least about 1 to about 20 (about 5% as thick), at least about 1 to about 30 (about 3% as thick), at least about 1 to about 40 (about 2.5% as thick), at least about 1 to about 50 (about 2% as thick), at least about 1 to about 100 (about 1% as thick), at least about 1 to about 250 (about 0.4% as thick), at least about 1 to about 500 (about 0.2% as thick), at least about 1 to about 1000 (about 0.1% as thick), and/or at least about 1 to about 10000 (about 0.01% as thick).

In some embodiments, a semiconductor light emitting device is provided comprising a light emitting source providing an emitted radiation; and a light emitting element, previously described herein, wherein the light emitting element is positioned to receive the radiation emitted from the light emitting source In one embodiment, a white LED can comprise a conventional base LED mounted on a submount, a sintered ceramic plate over the base LED, and an encapsulant resin covering the entire device. Suitable semiconductor lighting devices are described in U.S. Pat. No. 8,169,136, issued May 1, 2012, and United States Patent Application Publication 2012/0218,736, published Aug. 30, 2012 (application Ser. No. 13/402,668, filed Feb. 22, 2012), which are incorporated by reference in their entireties. In some embodiments, the light emitting source may be a blue LED or a blue-light emitting LED. A portion of the blue light emitted from the blue LED is absorbed by the light emitting element 10 comprising an emissive element 12 and light scattering element 14, and the sintered light emitting element then emits light with a different wavelength, such as yellow light. Other portion of blue light would be emitted by the blue LED without being absorbed by the sintered light emitting element 10. Consequently, both blue light and yellow light are emitted from the LED, and the human eye perceives that synthesized or mixed light as white light. The blue LED is typically formed by using AlInGaN based single crystal semiconductor material and is electrically connected when mounted on the submount. The blue LED can be capable of emitting blue light with a peak wavelength of about 440 nm to about 470 nm. In some embodiments, the light emitting source may be a violet or purple LED or a violet or purple-light emitting LED. The violet or purple-light emitting LED can be capable of emitting violet or purple-light with a peak wavelength of about 400 or 410 nm to about 440 nm. In some embodiments, the base LED may also be UV LED that emits a light with a peak wavelength of about 350 nm to about 400 or 410 nm. In some embodiments, translucent sintered ceramic plate light emitting element comprising phosphor material, can be capable of absorbing blue light from the blue LED and emitting yellow light, is placed or positioned over the blue LED to receive the radiation emitted from the light emitting source.

The sintered ceramics light emitting element 10 may be placed and/or fixed over the blue LED using an encapsulant resin, specific adhesive, or a mechanical holder. The encapsulant resin and adhesive may include any of silicone, epoxy, low-melting-point-glass, transparent adhesives, or other materials. In embodiments where UV LED is used instead of blue LED, epoxy or other material that has light absorption in the wavelength region of UV light emitted from the LED can be degraded. In addition, if the LED is driven at very high operating condition like powder LED, the close proximity of the LED surface can become hot and the adhesive can also be degraded. Therefore, thermally and UV-durable material like silicone and low-melting-point glass may be preferably utilized.

Particle Size Adjustment

Raw materials particles for tape casting in some cases are in nanometer scale. In order to avoid cracking of cast tapes caused by capillary force during evaporation of solvents, particle size of $Al_2O_3$, $Y_2O_3$, $Lu_2O_3$, and $Gd_2O_3$ need to be in appropriate range. Particle size of $Al_2O_3$, $Y_2O_3$, and $Gd_2O_3$ was adjusted by pre-annealing the particle in vacuum, $O_2$, $H_2$, $H_2/N_2$ and air in the temperature range of 800° C. to 1800° C., preferably in the range of 1000° C. to 1600° C., more preferably in the range of 1100° C. to 1400° C. Annealed particles have a BET surface area in the range of 0.5 to 20 $m^2/g$, preferably in the range of 1-10 $m^2/g$, more preferably in the range of 2 to 6 $m^2/g$.

Slurry Making

Described herein is the method to prepare aqueous slurry for fabricating yttrium aluminum garnet (YAG) and lutetium aluminum garnet (LuAG) green sheets by tape casting. Particles of $Al_2O_3$, $Y_2O_3$, Lu2O3, and $Gd_2O_3$ are mixed with dispersant, sintering aids (if necessary) and milli-Q water, subsequently, mixed by ball milling for 0.5 to 100 hrs, preferably 6 to 48 hrs, more preferably 12 to 24 hrs. This ball milled slurry was mixed with polymeric binder such as but not limited to acrylic polymers, plasticizers such as but not limited to 2-amino-2-methyl-1 propanol and polyethylene glycol (PEG). The average molecular weight of PEG is preferably in the range of 100 to 50000, more preferably in the range of 400 to 15000, e.g., 10,000.

Mixture was ball milled for 0.5 to 100 hrs, preferably 6 to 48 hrs, more preferably 12 to 24 hrs. The milling balls are, in one embodiment, comprised of material different from the host material, e.g., if the host material is YAG, then the ball material can comprise $ZrO_2$. Slurry was passed filter to separate the ball and slurry. Viscosity of slurry was adjusted to the range of 10 to 5000 centipoise (cP), preferably in the range of 50 to 4000 cP, more preferably in the range of 200 to 3000 centipoise (cP).

In some embodiments, organic material, e.g., generally spherical beads of desired material, can be provided for mixture in the precursor matrix. In some embodiments, the beads can be polymeric beads. In some embodiments, the beads can be cross-linked poly(methyl methacrylate). In some embodiments, the beads can be MA1006 (Nippon Shokubai) and/or SSX106 and/or SSX108 (SekiSui Chemical). In some embodiments, the beads are substantially entirely below 15 μm in diameter. In some embodiments, the average bead diameter can be between 1 μm, 2 μm, 3 μm, 4 μm, 5 μm and 10 μm, 12.5 μm and 15 μm and/or any combination of the aforedescribed bottom and top values. In some embodiments, the beads can be SSX106 beads. In some embodiments, the amount of the added polymeric beads, for example about 6 μm average diameter beads, can be about 10 vol % to about 80 vol %, about 20 vol % to about 50 vol %, for example about 40 vol % after removing all polymeric components during debinding without considering possible shrinkage at high temperature.

Tape Casting

Described herein is method of tape casting. Slurry with appropriate viscosity was cast on releasing substrate, for EXAMPLE silicone coated Mylar® (Polyethelene tetraphthalate) substrate, with an automated casting machine with a comma blade with an adjustable gap. Thickness of cast tape can be adjusted by comma blade gap, slurry viscosity and casting rate. The cast tape is dried at 50° C.~80° C. while heating of substrate. Green sheet with varied thickness are obtained after evaporation of water in cast tape. Gap of comma blade can be changed in the range of 30 to 1200 micron, preferably in the range of 50 to 800 micron more preferably in the range of 80 to 600 micron. The casting rate is preferably in the range of about 0.05 to about 1.50 [m/min], more preferably in the range of 0.10 to about 1.00 m/min, more preferably in the range of 0.15 to about 0.50 m/min. In this way, the thickness of green sheets can be adjusted in the range of 20 to 400 micrometers.

Lamination

Described herein is the method to produce composite of emissive and light scattering green sheets by lamination. Cast tapes comprising emissive and light scattering materials are cut into desired shape and dimension, and then assembled by stacking the single green sheet together. The total number of green sheet in stacking can be in the range of 2 to 100 depending on the thickness of single green sheet and activator concentration in emissive element. Stacking of cast tapes with emissive element located in top-most or bottom-most or between non-emissive elements is placed on the metal substrate, which made of metals such as anodized aluminum plate, etc. Cast tape stacking on the metal substrate is vacuum-bagged at room temperature. and then compressed in water at above glass transition temperature ($T_g$) of polymeric binder material at isostatic pressure in the range of 1 to 100 MPa, preferably 30 to 50 MPa. Pressure and heat applied to green sheet stacking are kept for 1 to 180 min, preferably between 10 min and 20 min, then released pressure.

Firing

Described herein is the method of applying a thermal treatment concurrently to the emissive element and the non-emissive element sufficient to concurrently sinter the elements into a single ceramic wavelength converting element. In some embodiments, the emissive element and the light scattering element comprise materials substantially sintered in the same manner as the garnet material described herein. The method of concurrently sintering laminated green sheet to a dense ceramic sheet is described herein. First, laminated green sheets disposed in the desired order, e.g., at least one light scattering layer disposed above, on, below, and/or between at least a first and or second emissive layers, the green sheets being sandwiched between cover plates made of $Al_2O_3$ not limited to $Al_2O_3$ with about 40% porosity to reduce the warping, cambering and bending of green sheet during debinding and sintering. Plurality of green sheets can be stacked between porous $Al_2O_3$ cover plates alternatively. Green sheets are debinded in air to decompose the organic components such as binders, plasticizers in the range of 300° C. to 800° C., preferably 500° C. to 700° C., more preferably 600° C. at rate of 0.01 to 10° C./min, preferably 0.05° C. to 5.0° C./min, more preferably 0.1 to 4.0° C./min and kept for 30 to 300 min depending to the thickness of laminated green sheets.

Then the binder-free blank samples are Bisk-fired to the temperature in the range of 800 to 1500° C., preferably 900 to 1400° C., more preferably 1200° C. at rate of 0.01 to 10° C./min, preferably 0.05 to 5.0° C./min, more preferably 0.1 to 4.0° C./min and kept for 30 to 300 min depending to the thickness of laminated green sheets.

After debinding and Bisque-firing, the binder-free blank samples are sintered in vacuum, $H_2/N_2$, $H_2$, $Ar/H_2$ at temperature ranging from 1200° C. to 1900° C., preferably 1500° C. to 1880° C. more preferably 1600 to 1870° C., for example 1800° C. or 1845° C. for duration from 1 hr to 100 hrs, preferably 2 to 36 hrs. The sintering results in the grain growth of matrix ceramics beyond the former interface between green sheets. The former interfaces between green sheets does not have a mismatch of refractive index, causing light scattering. Debinding and sintering can be carried out separately or operated at one step except atmosphere switching. Laminated green sheets sintered in reducing atmosphere are usually brownish or dark brown in color due to the formation of defects such as oxygen vacancy etc. during sintering. Re-oxidation in air or oxygen atmosphere is usually necessary to render the ceramic sheet high transmittance in visible light wavelength range. Re-oxidation is conducted in the temperature range of 1000° C. to 1500° C. for 30 to 300 min at heating rate of 1 to 20° C./min, preferably 1400° C. for 2 hrs at 5° C./min. Layers cast at 30 μm and 60 μm can shrink during the process to about 23 μm and 46 μm, respectively.

Method for Total Light Transmittance of Phosphor Ceramics

The total light transmittance of the obtained ceramic plates was measured by high sensitivity multi channel photo detector (MCPD 7000, Otsuka Electronics, Inc). First, air w/o any sample was irradiated with continuous spectrum light from a halogen lamp source (150W, Otsuka Electronics MC2563) to obtain reference transmission data. Next the phosphor ceramic plate was placed and irradiated. The transmitted spectrum was acquired by the photo detector (MCPD) for each sample. Transmittance at 800 nm wavelength of light was used as a quantitative measure of transparency of the obtained ceramics.

Evaluation Method for Efficacy of White LED w/Phosphor Ceramic Plate

Efficacy of white LED can be evaluated based on radiation supplied from LED chip. Therefore, the efficacy is calculated from the following equation while measuring white light with phosphor ceramics on the top of LED as well as blue light of LED without phosphor:

$$\text{Efficacy} = \frac{\Phi_v}{\Phi_{e-Blue}}$$

where $\Phi_v$ is the luminous flux in lm of white LED consisting of blue LED and a phosphor plate on the top of LED, and $\Phi_{e-Blue}$ is the blue LED radiation in W. $\Phi_v$ and $\Phi_{e-Blue}$ can be calculated as follows:

$$\Phi_v = 683 \int_{380}^{780} P_{White}(\lambda) V(\lambda) d\lambda$$

$$\Phi_{e-Blue} = \int_{380}^{780} P_{Blue}(\lambda) d\lambda$$

where $\lambda$ is the light wavelength in nm, $P_{White}(\lambda)$ is the wavelength-depending intensity of white light in W/nm, $V(\lambda)$ is the luminosity curve, and $P_{Blue}(\lambda)$ is the wavelength-depending intensity of blue LED in W/nm.

EXAMPLES

It has been discovered that embodiments of light emitting elements described herein improve the efficiency of the light emitting device. While not wanting to be limited by theory, it is believed that the inconsistent refractive indices increase the light extracted from the device. These and other benefits are further shown by the following examples, which are intended to be illustrative of the embodiments of the disclosure, but are not intended to limit the scope or underlying principles in any way.

Example 1

Emissive Layer Slurry Preparation

Aqueous slurry was prepared with the formulation shown in Table 1. In order to prepare an emissive green sheet, e.g., EX 1, leading to 0.25% Ce-doped and 10% Gd-doped transparent YAG phosphor plate, 42.60 g $Y_2O_3$ particles with a BET surface area of 2.75+/−0.25 $m^2$/g, 7.62 g $Gd_2O_3$ particles with a BET surface area of 2.00+/−0.25 $m^2$/g, 35.72 g $Al_2O_3$ particles with a BET surface area of 5.58+/−0.11 $m^2$/g, 180.9 mg $CeO_2$ particles with a BET surface area of 5.41+/−0.10 $m^2$/g, 13.50 g of aqueous acrylic polymer (Polymer Innovations, Vista, Calif., USA) solution, whose solid content is 35 wt %, as a main component of polymeric binder for final green sheet, 0.16 g 2,4,7,9-tetramethyl-5-decyne-4,7-diol ethoxylate as a defoamer for aqueous slurry, 1.56 g 2-amino-2-methyl-1 propanol as a plasticizer, and 30.00 g milli-Q water were added to a 8 oz (0.231) polypropylene (PP) thick wall jar, whose inner diameter is 80 mm (Parkway Plastics Inc., Piscataway, N.J., USA), for aqueous slurry preparation. The $Y_2O_3$ and the $Gd_2O_3$ particles had been calcinated at 1400° C. and 1200° C., respectively, in air to have the desired surface area before this slurry preparation. Then, 380 g $ZrO_2$ milling media of 5~10 mm diameter were added to the PP jar. After ball-milling for the initial 16 hrs, an additional 18.68 g of the same aqueous acrylic polymer solution was added to the milled solution of ceramic particles in the PP jar to finally contain 60 vol % ceramic particles in the final slurry. Additional slurry preparations were prepared in a similar manner except for varying the respective materials as described in Table 1.

TABLE 1

| Examples | Ce-doping, at % | Gd-doping, at % | Y₂O₃ powder, g | Lu₂O₃ powder, g | Gd₂O₃ powder, g | Al₂O₃ powder, g | CeO₂ powder, mg | Aqueous acrylic polymer solution, g | Defoamer, g | Plasticizer, g | Milli-Q water, g | Aqueous acrylic polymer solution, g | Polymeric beads, g | Beads loading | Cast green sheet thickness, um |
|---|---|---|---|---|---|---|---|---|---|---|---|---|---|---|---|
| EX1, EX2b, & COMP EX1 | 0.25 | 10 | 42.60 | | 7.62 | 35.72 | 181 | 13.50 | 0.16 | 1.56 | 30.00 | 18.68 | | | 52 |
| EX2a | 0.275 | 10 | 42.59 | | 7.62 | 35.72 | 199 | 13.50 | 0.16 | 1.56 | 30.00 | 18.67 | | | 52 |
| EX2c & COMP EX2 | 0.20 | 10 | 42.63 | | 7.62 | 35.72 | 145 | 13.50 | 0.16 | 1.56 | 30.00 | 18.68 | | | 52 |
| EX2d | 0.15 | 10 | 42.65 | | 7.62 | 35.73 | 109 | 13.50 | 0.16 | 1.56 | 30.00 | 18.68 | | | 52 |
| COMP EX3, EX8, & EX18 | 0.30 | 10 | 42.57 | | 7.62 | 35.72 | 217 | 13.50 | 0.16 | 1.56 | 30.00 | 18.67 | | | 52 |
| COMP EX4a | 0.25 | 10 | 42.60 | | 7.62 | 35.72 | 181 | 13.50 | 0.16 | 1.56 | 30.00 | 18.68 | 1.43 | 6 vol % of 6 um beads | 52 |
| COMP EX4b | 0.20 | 10 | 42.63 | | 7.62 | 35.72 | 145 | 13.50 | 0.16 | 1.56 | 30.00 | 18.68 | 1.43 | 6 vol % of 6 um beads | 52 |
| COMP EX4c | 0.15 | 10 | 42.65 | | 7.62 | 35.73 | 109 | 13.50 | 0.16 | 1.56 | 30.00 | 18.68 | 1.43 | 6 vol % of 6 um beads | 52 |
| EXs 3 & 4 | 0.25 | 10 | 42.60 | | 7.62 | 35.72 | 181 | 13.50 | 0.16 | 1.56 | 30.00 | 18.68 | 1.93 | 8 vol % of 2 um beads | 52 |
| EX5 | 0.20 | 10 | 42.63 | | 7.62 | 35.72 | 145 | 13.50 | 0.16 | 1.56 | 30.00 | 18.68 | 1.93 | 8 vol % of 2 um beads | 52 |
| EX6 & COMP EX5 | 0.275 | 25 | | 57.35 | 17.41 | 32.75 | 182 | 15.00 | 0.14 | 1.41 | 28.33 | 14.10 | 1.75 | 8 vol % of 2 um beads | 52 |
| EX7 | 0.40 | 10 | 42.52 | | 7.62 | 35.71 | 289 | 13.50 | 0.16 | 1.56 | 30.00 | 18.67 | | | 63 |
| EXs 8a, 9, & 10 | 0.35 | 10 | 42.54 | | 7.62 | 35.71 | 253 | 13.50 | 0.16 | 1.56 | 30.00 | 18.67 | | | 63 |
| EXs 8b, 11, & 12 | 0.30 | 10 | 42.57 | | 7.62 | 35.72 | 217 | 13.50 | 0.16 | 1.56 | 30.00 | 18.67 | | | 63 |
| EX8c & COMP EX6 | 0.25 | 10 | 42.60 | | 7.62 | 35.72 | 181 | 13.50 | 0.16 | 1.56 | 30.00 | 18.68 | | | 63 |
| EX8d | 0.20 | 10 | 42.63 | | 7.62 | 35.72 | 145 | 13.50 | 0.16 | 1.56 | 30.00 | 18.68 | | | 63 |
| EX13a | 0.45 | 7.5 | 43.96 | | 5.75 | 35.94 | 328 | 13.50 | 0.16 | 1.56 | 30.00 | 18.82 | | | 63 |
| EX13b | 0.40 | 7.5 | 43.99 | | 5.75 | 35.94 | 291 | 13.50 | 0.16 | 1.56 | 30.00 | 18.82 | | | 63 |
| EXs 13c & 14 | 0.35 | 7.5 | 44.02 | | 5.75 | 35.95 | 255 | 13.50 | 0.16 | 1.56 | 30.00 | 18.82 | | | 63 |
| EX13d | 0.25 | 7.5 | 44.07 | | 5.75 | 35.95 | 182 | 13.50 | 0.16 | 1.56 | 30.00 | 18.83 | | | 63 |
| EX15a | 0.425 | 5 | 45.46 | | 3.86 | 36.18 | 311 | 13.50 | 0.16 | 1.57 | 30.00 | 18.97 | | | 63 |
| EX15b | 0.40 | 5 | 45.48 | | 3.86 | 36.18 | 293 | 13.50 | 0.16 | 1.57 | 30.00 | 18.97 | 1.95 | 8 vol % of 2 um beads | 63 |
| EX15c | 0.35 | 5 | 45.51 | | 3.86 | 36.18 | 257 | 13.50 | 0.16 | 1.57 | 30.00 | 18.98 | 1.95 | 8 vol % of 2 um beads | 63 |
| EX15d, EX16, EX17 & COMP EX7 | 0.30 | 5 | 45.54 | | 3.86 | 36.19 | 220 | 13.50 | 0.16 | 1.57 | 30.00 | 18.98 | 1.95 | 8 vol % of 2 um beads | 63 |
| EX18, EX19a, EX20 & COMP EX8 | 0.40 | 10 | 42.52 | | 7.62 | 35.71 | 289 | 13.50 | 0.16 | 1.56 | 30.00 | 18.67 | | | 52 |
| EX19b | 0.35 | 10 | 42.54 | | 7.62 | 35.71 | 253 | 13.50 | 0.16 | 1.56 | 30.00 | 18.67 | | | 52 |

Outcoupling Layer Slurry Preparation

In order to separately prepare an outcoupling green sheet leading to 10% Gd-doped light scattering YAG phosphor layer for enhancing light out-coupling (OC layer A in Table 2), 32.85 g $Y_2O_3$ particles, 5.86 g $Gd_2O_3$ particles, 27.46 g $Al_2O_3$ particles, 10.80 g aqueous acrylic polymer solution, whose solid content is 35 wt %, as a main component of polymeric binder for final green sheet, 0.12 g 2,4,7,9-tetramethyl-5-decyne-4,7-diol ethoxylate as a defoamer for aqueous slurry, 1.20 g 2-amino-2-methyl-1 propanol as a plasticizer, 2.39 g aqueous solution of polyethylene glycol, whose solid content is 50 wt % and in which the Mw of PEG is approximately 10000, and 28.80 g milli-Q water were added to a 8 oz (0.23 L) PP jar, whose inner diameter was 80 mm (Parkway Plastics Inc., Piscataway, N.J.), for aqueous slurry preparation, as shown in Table 2. The BET surface areas of all inorganic powders remained the same as the slurry preparation for emissive layers. Then, 380 g $ZrO_2$ milling media of 5-10 mm diameter were added to the PP jar. After ball-milling for the initial 16 hrs, an additional 10.52 g of the same aqueous acrylic polymer solution as well as 11.40 g of polymeric beads, which were made of cross-linked poly(methyl methacrylate) and were with a bead diameter of 6 μm (Nippon Shokubai, Japan) were added to the milled solution of ceramic particles in the PP jar. This amount of the added polymeric beads was to be 40 vol % after removing all polymeric components during debinding without considering possible shrinkage at high temperature. After the addition of the polymeric beads, the secondary ball-milling was applied for 4 extra hrs. After debinding and sintering, the positions with 6 micron beads become pores, and the resulting porous structure leads to the enhanced light out-coupling. Additional slurry preparations for other examples were prepared in a similar manner, except for varying the respective materials as described in Table [4]. Repeated examples of the same composition are indicated by a lower case alphanumeric after the example number, e.g., 1a, 1b, etc.

Laminated Compacts (Casting/Laminating)

When the entire ball milling process was completed, the resultant slurry[s], e.g., the emissive and outcoupling green sheet slurries prepared as described above, was filtered through a syringe-aided metal screen filter with pore size of 0.05 mm, in order to remove aggregated ceramic particles. Viscosity of the resulting slurry was in the range of 300 cP to 6000 cP. All slurry was then cast on 75 μm thick silicone-coated polyethylene terephthalate Mylar substrate film (Hansung Systems Inc., Republic of Korea) using an automated roll-to-roll tape caster (Hansung Systems Inc., Republic of Korea) attached with a comma blade at a cast rate of about 200 mm/min. The blade gap of the film applicator was adjusted depending on the desired green sheet thickness. The respective green sheet thickness of emissive layer with 0.25% Ce-doping and 10% Gd-doping (emissive layer) and that w/40 vol % polymeric beads and 10% Gd-doping without Ce-doping (outcoupling layer) were approximately 52 micron thick as shown in Table 1 and 30 micron thick as shown in Table 2, respectively. The cast tape was dried at 50-80° C. at two different heat zones with a length of 1.5 m each, to finally obtain a YAG ceramic green sheet.

The dried green sheet was cut to be about 90 mm×90 mm using a razor blade. Two different laminates were prepared to observe the effect of the added light scattering layer for enhanced light out-coupling through comparison of two samples, one with and one without an OC layer. One sample in Example 1 was comprised of three layers of 52 micron thick 0.25% Ce-doped emissive layers. Other samples were made in a similar manner except that a layer of 30 micron thick light scattering layer (OC layer A as shown in Tables 1 and 2) was disposed on the top of 3 layers of 52 micron thick 0.25% Ce-doped emissive layers. Additional laminates were prepared in a similar manner, except for varying the number of layers, thicknesses, order of the layers, etc., as described in Table [1]. All such laminates were assembled on an anodized aluminum plate, and this assembly was vacuum-bagged before isostatic pressing. This assembly was laminated using a cold isostatic press (CIP) at 42 MPa at 85° C. for 10 min using an ILS-66 isostatic lamination press (Keko Equipment, Slovenia). As a result, an approxi-

TABLE 2

| | For initial 16 hr-milling | | | | | | | | | For final 4 hr-milling | | | Cast |
|---|---|---|---|---|---|---|---|---|---|---|---|---|---|
| | $Y_2O_3$ powder, g | $Gd_2O_3$ powder, g | $Al_2O_3$ powder, g | $CeO_2$ powder, mg | Aqueous acrylic polymer solution, g | Defoamer, g | Plasticizer, g | PEG solution, g | Milli-Q water, g | Aqueous acrylic polymer solution, g | Polymeric beads, g | Diameter of polymeric beads, um | green sheet thickness, um |
| OC layer A | 32.85 | 5.86 | 27.46 | | 10.80 | 0.12 | 1.20 | 2.39 | 28.80 | 10.52 | 11.40 | 6 | 30 |
| OC layer B | 32.85 | 5.86 | 27.46 | | 10.80 | 0.12 | 1.20 | 2.39 | 28.80 | 10.52 | 11.40 | 4 | 30 |
| OC layer C | 32.85 | 5.86 | 27.46 | | 10.80 | 0.12 | 1.20 | 2.39 | 28.80 | 10.52 | 17.10 | 4 | 30 |
| OC layer D | 32.85 | 5.86 | 27.46 | | 10.80 | 0.12 | 1.20 | 2.39 | 28.80 | 10.52 | 7.33 | 4 | 30 |
| OC layer E | 30.66 | 5.47 | 25.63 | | 10.80 | 0.11 | 1.12 | 2.23 | 34.88 | 9.10 | 10.64 | 8 | 30 |
| OC layer F | 30.58 | 5.47 | 25.62 | 104 | 10.80 | 0.11 | 1.12 | 2.23 | 34.88 | 9.09 | 10.64 | 8 | 30 |
| OC layer G | 48.75 | | 36.69 | | 13.50 | 0.16 | 1.59 | | 30.00 | 19.31 | 2.52 | 6 | 60 |
| OC layer H | 48.75 | | 36.69 | | 13.50 | 0.16 | 1.59 | | 30.00 | 19.31 | 5.67 | 6 | 60 |
| OC layer I | 32.76 | 5.86 | 27.45 | 111 | 10.80 | 0.12 | 1.20 | 2.39 | 28.80 | 10.51 | 11.40 | 4 | 30 | mately 145 micron (without OC layer)~175 micron (with OC layer) thick green laminates were obtained. The green laminates were then laser-cut to a 43 mm×43 mm cubic shape using a VLS 2.30 laser engraving and cutting system (Universal Laser Systems) with a 25 W $CO_2$ laser for the following Bisque-firing.

Debindering

As the next step, the polymeric binder was removed from the laminated compacts. The laminated compacts were sandwiched between $Al_2O_3$ porous cover plates with 40% nominal porosity, in order to avoid the warping, cambering and bending of the laminated compacts during the debinding process. A plurality of green laminate compacts were stacked between porous $Al_2O_3$ cover plates (ESL Electro-Science, King of Prussia, Pa.), alternately. The laminated compacts were heated to about 1200° C. for about 2 hrs in air using a ST-1700C-445 box furnace (SentroTech Corporation, Brea, Ohio) for de-binding and Bisque-firing. The heating and cooling rates were <0.7° C./min and <4.0° C./min, respectively. The debinded/Bisque-fired blank samples were fully sintered at 1800° C. for 10 hrs, as shown in Table 1, at 2-5 psig pressure in $N_2$/3% $H_2$ gas atmosphere using a high temperature furnace whose heating elements were made of tungsten and which was attached with a mechanical and a diffusion pumps. Inside the furnace chamber, the blank samples were sandwiched with a 50 mm×50 mm square of tungsten mesh (mesh density of about 60×60), alternately. Different transparency (total light transmittance, $T_t$%) of the sintered ceramics was obtained with locating multiple samples at different locations inside the chamber, due to the non-homogeneous temperature distribution inside the tungsten furnace chamber during sintering.

The heating rate of this final sintering process was about 16.7° C./min (~400° C.), 8.0° C./min (400-1000° C.), 2.5° C./min (1000° C.-1400° C.), 1.7° C./min (1400° C.-1500° C.), and 0.8° C./min (1500° C.-1800° C.), whereas the cooling rate was 8.0° C./min in order to minimize cracking during sintering.

Figure 1C:
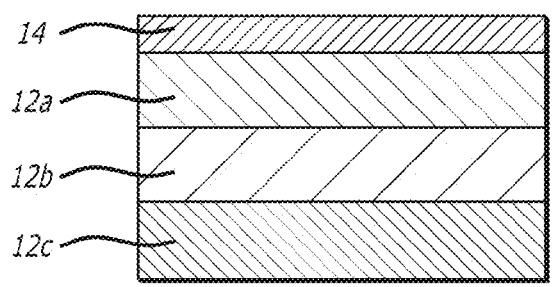
FIG. 1C is a schematic depiction of an embodiment of a ceramic element with a light extraction element.

The resulting YAG ceramics sintered in $N_2$/3% $H_2$ gas atmosphere were usually slightly brownish or dark brown in color due to the oxygen nonstoichiometry caused during sintering. A re-oxidation was conducted at 1400° C. for about 2 hrs under low vacuum pressure (~20 Torr) at heating and cooling rate of <4.0° C./min using GSL-1700X-80 bench-top single zone tube furnace (MTI Corporation). As a result 0.25% Ce-doped and 10% Gd-doped YAG ceramics with and without light scattering layer (OC layer A) were obtained after the end of sintering and re-oxidation. The thickness of the obtained phosphor ceramic plate was in the range of 120 micron (without OC layer A)~145 micron (with OC layer A) thick. After sintering the element without the light scattering layer, the element comprised plural layers (3) (see 12A, 12B, 12C) of about 40 micron thick emissive layers, see FIG. 1B and the element with the light scattering layer comprised plural (3) layers (12A, 12B, 12C) of about 40 micron thick emissive layers with a light scattering layer 14 of about 23 microns thick disposed thereon (FIG. 1C). The plural (3) emissive layers can be disposed between the outcoupling layer 14 and the light source/LED (not shown), in other words the outcoupling layer 14 can be above or on top of the emissive layer[s]. Additional embodiments were laminated and sintered as described herein, except that the outcoupling layer type, layering order, sintering temperature, sintering time, etc., was varied, as set forth in Table 3. The sintering conditions, composition and the characteristics of the sintered outcoupling layers (OC-A to OC-I) [1] were varied, as set forth in Table 4.

TABLE 3

| Examples | Host matrix | Ce-doping of emissive layer, at % | Gd-doping of emissive layer, at % | Emissive layer thickness after sintering, um | Beads loading | Used OC layer type | Thickness of added OC layer after sintering, um | Sintering temp, ° C. | Sintering hours, |
|---|---|---|---|---|---|---|---|---|---|
| EX1a | YAG | 0.25 | 10 | 120 | N/A | OC layer A | 23 | 1800 | 10 |
| EX1b | YAG | 0.25 | 10 | 120 | N/A | OC layer A | 23 | 1800 | 10 |
| EX1c | YAG | 0.25 | 10 | 120 | N/A | OC layer A | 23 | 1800 | 10 |
| EX1d | YAG | 0.25 | 10 | 120 | N/A | OC layer A | 23 | 1800 | 10 |
| EX1e | YAG | 0.25 | 10 | 120 | N/A | OC layer A | 23 | 1800 | 10 |
| COMP EX1 | YAG | 0.25 | 10 | 120 | N/A | OC layer A | 23 | 1800 | 10 |
| EX2a | YAG | 0.275 | 10 | 120 | N/A | OC layer A | 23 | 1800 | 10 |
| EX2b | YAG | 0.25 | 10 | 120 | N/A | OC layer A | 23 | 1800 | 10 |
| EX2c | YAG | 0.20 | 10 | 120 | N/A | OC layer A | 23 | 1800 | 10 |
| EX2d | YAG | 0.15 | 10 | 120 | N/A | OC layer A | 23 | 1800 | 10 |
| COMP EX2 | YAG | 0.20 | 10 | 120 | N/A | OC layer A | 23 | 1800 | 10 |
| COMP EX3 | YAG | 0.30 | 10 | 120 | N/A | | | 1825 | 20 |
| COMP EX4a | YAG | 0.25 | 10 | 120 | 6 vol % of 6 um beads | | | 1800 | 5 |
| COMP EX4b | YAG | 0.20 | 10 | 120 | 6 vol % of 6 um beads | | | 1800 | 5 |
| COMP EX4c | YAG | 0.15 | 10 | 120 | 6 vol % of 6 um beads | | | 1800 | 5 |
| EX3 | YAG | 0.25 | 10 | 120 | 8 vol % of 2 um beads | OC layer B | 23 | 1800 | 20 |
| EX4 | YAG | 0.25 | 10 | 120 | 8 vol % of 2 um beads | OC layer C | 23 | 1800 | 20 |
| EX5 | YAG | 0.20 | 10 | 120 | 8 vol % of 2 um beads | OC layer C | 23 | 1800 | 10 |
| EX6 | LuAG | 0.275 | 25 | 120 | 8 vol % of 2 um beads | OC layer A | 23 | 1800 | 20 |
| COMP EX5 | LuAG | 0.275 | 25 | 120 | 8 vol % of 2 um beads | | | 1800 | 7 |
| EX7 | YAG | 0.40 | 10 | 100 | N/A | OC layer D | 23 | 1800 | 10 |
| EX8a | YAG | 0.35 | 10 | 100 | N/A | OC layer A | 23 | 1830 | 20 |
| EX8b | YAG | 0.30 | 10 | 100 | N/A | OC layer A | 23 | 1830 | 20 |
| EX8c | YAG | 0.25 | 10 | 100 | N/A | OC layer A | 23 | 1830 | 20 |

TABLE 3-continued

| Examples | Host matrix | Ce-doping of emissive layer, at % | Gd-doping of emissive layer, at % | Emissive layer thickness after sintering, um | Beads loading | Used OC layer type | Thickness of added OC layer after sintering, um | Sintering temp, °C. | Sintering hours, |
|---|---|---|---|---|---|---|---|---|---|
| EX8d | YAG | 0.20/0.25 | 10 | 100 | N/A | OC layer A | 23 | 1830 | 20 |
| COMP EX6 | YAG | 0.25 | 10 | 100 | N/A | OC layer A | 23 | 1830 | 20 |
| EX9 | YAG | 0.35 | 10 | 100 | N/A | OC layer E | 23 | 1820 | 20 |
| EX10 | YAG | 0.35 | 10 | 100 | N/A | OC layer F | 23 | 1820 | 20 |
| EX11 | YAG | 0.30 | 10 | 100 | N/A | OC layer G | 46 | 1830 | 10 |
| EX12 | YAG | 0.30 | 10 | 100 | N/A | OC layer H | 46 | 1845 | 10 |
| EX13a | YAG | 0.40/0.45 | 7.5 | 100 | N/A | OC layer A | 23 | 1830 | 20 |
| EX13b | YAG | 0.40 | 7.5 | 100 | N/A | OC layer A | 23 | 1830 | 20 |
| EX13c | YAG | 0.35 | 7.5 | 100 | N/A | OC layer A | 23 | 1830 | 20 |
| EX13d | YAG | 0.25 | 7.5 | 100 | N/A | OC layer A | 23 | 1830 | 20 |
| EX14 | YAG | 0.35 | 7.5 | 100 | N/A | OC layer A | 23 | 1800 | 20 |
| EX15a | YAG | 0.425 | 5 | 100 | 8 vol % of 2 um beads | OC layer A | 23 | 1830 | 20 |
| EX15b | YAG | 0.40 | 5 | 100 | 8 vol % of 2 um beads | OC layer A | 23 | 1830 | 20 |
| EX15c | YAG | 0.35 | 5 | 100 | 8 vol % of 2 um beads | OC layer A | 23 | 1830 | 20 |
| EX15d | YAG | 0.30 | 5 | 100 | 8 vol % of 2 um beads | OC layer A | 23 | 1830 | 20 |
| COMP EX7 | YAG | 0.30 | 5 | 100 | 8 vol % of 2 um beads | OC layer A | 23 | 1830 | 20 |
| EX16 | YAG | 0.30 | 5 | 100 | 8 vol % of 2 um beads | OC layer G | 46 | 1830 | 10 |
| EX17 | YAG | 0.30 | 5 | 100 | 8 vol % of 2 um beads | OC layer H | 46 | 1845 | 10 |
| EX18 | YAG | 0.30/0.40 | 10 | 80 | N/A | OC layer A | 23 | 1800 | 10 |
| COMP EX8 | YAG | 0.30/0.40 | 10 | 80 | N/A | OC layer A | 23 | 1800 | 10 |
| EX19a | YAG | 0.40 | 10 | 80 | N/A | OC layer A | 23 | 1800 | 10 |
| EX19b | YAG | 0.35 | 10 | 80 | N/A | OC layer A | 23 | 1800 | 10 |
| EX20 | YAG | 0.40 | 10 | 80 | N/A | OC layer I | 23 | 1800 | 10 |

TABLE 4

| OC layer types | Matrix crystal | Ce-doping of OC layer, at % | Gd-doping of OC layer, at % | Bead loading, vol % | Original bead diameter, micron | OC layer thickness after sintering, micron |
|---|---|---|---|---|---|---|
| OC layer A | YAG | 0 | 10 | 40 | 6 | 23 |
| OC layer B | YAG | 0 | 10 | 40 | 4 | 23 |
| OC layer C | YAG | 0 | 10 | 50 | 4 | 23 |
| OC layer D | YAG | 0 | 10 | 30 | 4 | 23 |
| OC layer E | YAG | 0 | 10 | 40 | 8 | 23 |
| OC layer F | YAG | 0.20 | 10 | 40 | 8 | 23 |
| OC layer G | YAG | 0 | 0 | 10 | 6 | 46 |
| OC layer H | YAG | 0 | 0 | 20 | 6 | 46 |
| OC layer I | YAG | 0.20 | 10 | 40 | 4 | 23 |

Total light transmittance ($T_t$%) of both samples was performed with an Otsuka Electronics MCPD 7000 multi channel photo detector system (Osaka, JPN). First, air without any sample was irradiated with continuous spectrum light from a halogen lamp source (150 W, Otsuka Electronics MC2563) to obtain reference transmission data. Next the phosphor ceramic plate was placed and irradiated. Especially for the sample with light scattering layer, $T_t$% was measured with the incident light onto either the normal ceramic surface or the light scattering surface, since the measured $T_t$% is depending on the incident light direction. The transmitted spectrum was acquired by the photo detector (MCPD) for each sample. Transmittance at 800 nm wavelength of light was used as a quantitative measure of transparency of the obtained ceramics.

Efficacy of the white LED consisting of the phosphor ceramics on the blue LED was also performed with an Otsuka Electronics MCPD 9800 multi channel photo detector system (Osaka, JPN) connected with an integrate sphere (Gamma Scientific, San Diego Calif.) whose diameter is 300 mm. First the blue LED, peak position of whose blue light is at 450 nm, was irradiated with 100 mA constant current, and record the light intensity. Then, the phosphor ceramic, which was diced to be 1.03×1.03 mm, was placed on the top of the same blue LED, and the white light intensity was recorded. Especially, when the phosphor ceramics having the light scattering layer was placed on the blue LED, such a ceramics was placed as the emissive layer was attached on the surface of LED; the ceramics was placed with the light scattering layer (OC layer) up. The efficacy at the color position of Ccx=0.30 was calculated with fitting the following equations on the measured experimental data:

$$y = ax.$$

where x is the color (Ccx) of the measured LED device with phosphor ceramics, y is the efficacy (lm/W), and a is a constant depending on different samples. Efficacy needs to be compared with this extrapolated efficacy at the color position of Ccx=0.30, since the absolute value of the efficacy increases with increasing the color position in general. By ceramic samples with the same efficacy, the bluer LED device shows lower absolute efficacy value with a lower Ccx value, whereas the yellower LED device shows higher absolute efficacy value with a higher Ccx value.

Figure 2:
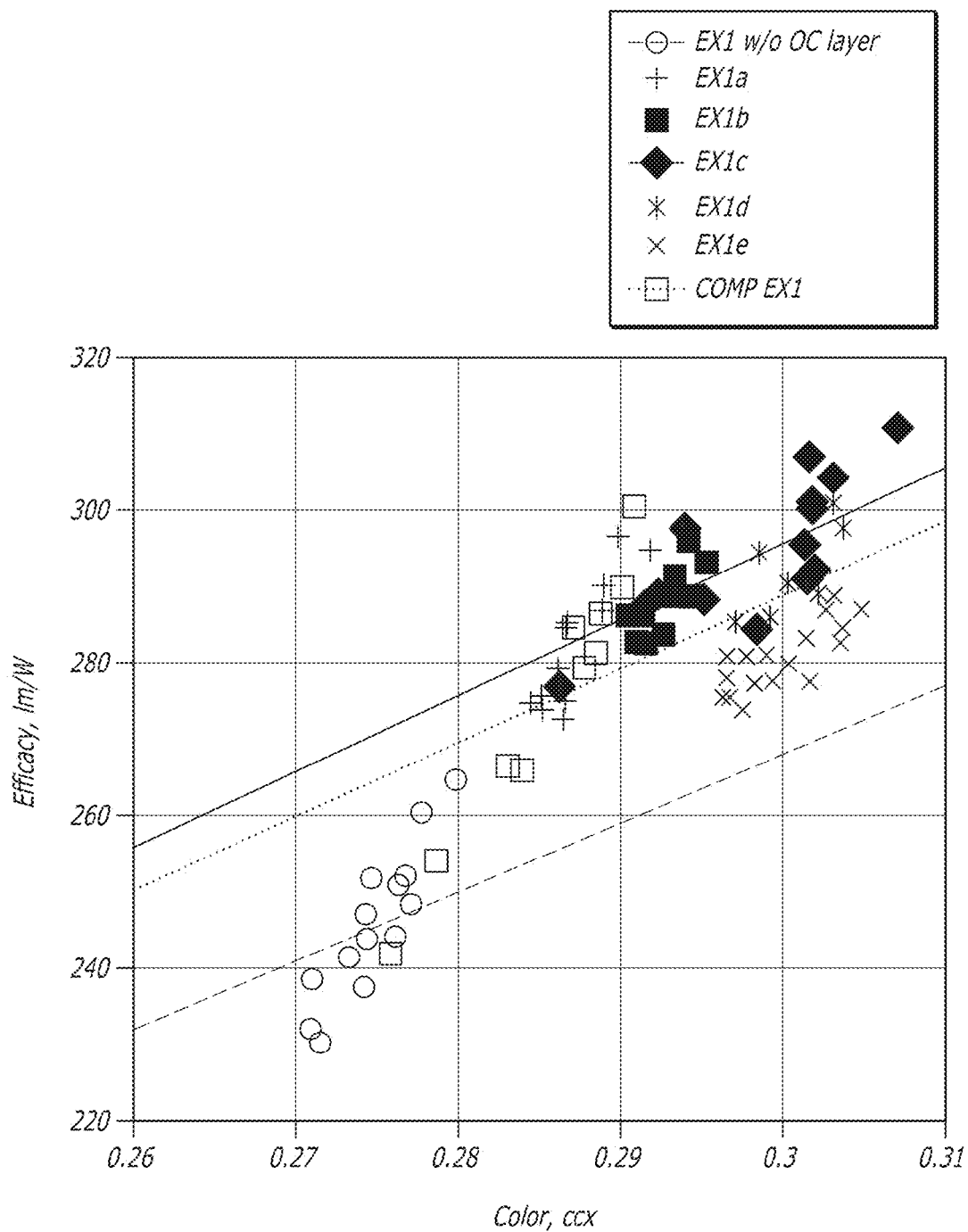
FIG. 2 shows example plots of luminous efficacy against color position, Ccx, of multiple devices of Example 1 as well as Comparative example 1.

FIG. 2 shows the raw data of the efficacy versus color position (Ccx) of the resulting white LED with different phosphor ceramic plates. In order to compare the efficacy regardless of the color position of the white LED, the least-squares line of the above equation was fit to the data points in FIG. 2, and then the efficacy value was estimated at the color position of Ccx=0.30 for all following samples. Examples of the least-squares fit lines to transparent ceramic sample without the OC layer and EX1c are shown in FIG. 2. The summary of the data is shown in Table 5. It was observed that the color position was adjustable with changing the $T_t$%. Resulting data of $T_t$%, efficacy, and color position of all examples are summarized in Table 5. Samples with OC layers showed better efficacy than transparent sample without OC layer. Efficacy was maximized by adjusting $T_t$%.

| | Tt % | | | W/o OC layer | | | W/co-sintered OC layer | | | |
|---|---|---|---|---|---|---|---|---|---|---|
| Examples | W/o light scattering layer | W/co-sintered OC layer, incident beam onto emissive surface | W/co-sintered OC layer, incident beam onto OC layer surface | Efficacy at Ccx = 0.30, lm/W | Color position, Ccx | Color position, Ccy | Efficacy at ccx = 0.30, lm/W | Color position, Ccx | Color position, Ccy | Note |
| EX1a | 86 | 84 | 78 | 269 | 0.275 | 0.264 | 295 | 0.287 | 0.289 | OC layer facing up on LED |
| EX1b | 86 | 78 | 72 | 269 | 0.275 | 0.264 | 296 | 0.292 | 0.299 | OC layer facing up on LED |
| EX1c | 86 | 69 | 65 | 269 | 0.275 | 0.264 | 296 | 0.298 | 0.309 | OC layer facing up on LED |
| EX1d | 86 | 67 | 64 | 269 | 0.275 | 0.264 | 288 | 0.299 | 0.311 | OC layer facing up on LED |
| EX1e | 86 | 62 | 60 | 269 | 0.275 | 0.264 | 281 | 0.301 | 0.314 | OC layer facing up on LED |
| COMP EX1 | 86 | 78 | 72 | 269 | 0.275 | 0.264 | 289 | 0.285 | 0.284 | Same sample as EX1b. OC layer attached on LED surface. |
| EX2a | 87 | 76 | 71 | 281 | 0.282 | 0.277 | 296 | 0.300 | 0.311 | OC layer facing up on LED |
| EX2b | 87 | 73 | 69 | 289 | 0.279 | 0.272 | 305 | 0.290 | 0.296 | OC layer facing up on LED |
| EX2c | 87 | 79 | 73 | 293 | 0.279 | 0.271 | 310 | 0.280 | 0.274 | OC layer facing up on LED |
| EX2d | 87 | 74 | 69 | 295 | 0.255 | 0.230 | 310 | 0.275 | 0.268 | OC layer facing up on LED |
| COMP EX2 | 87 | 79 | 73 | 293 | 0.279 | 0.271 | 300 | 0.275 | 0.265 | Same sample as EX2c. OC layer attached on LED surface. |
| COMP EX3 | 81 | | | 294 | 0.296 | 0.313 | | | | Void trapped into grains. |
| COMP EX4a | 66 | | | 295 | 0.302 | 0.315 | | | | Void homogeneously distributed. |
| COMP EX4b | 64 | | | 295 | 0.293 | 0.302 | | | | Void homogeneously distributed. |
| COMP EX4c | 69 | | | 301 | 0.275 | 0.270 | | | | Void homogeneously distributed. |
| EX3 | 87 | 77 | 73 | 289 | 0.279 | 0.272 | 305 | 0.293 | 0.300 | OC layer facing up on LED |
| EX4 | 87 | 77 | 70 | 289 | 0.279 | 0.272 | 310 | 0.298 | 0.309 | OC layer facing up on LED |
| EX5 | 87 | 72 | 67 | 293 | 0.279 | 0.271 | 311 | 0.284 | 0.286 | OC layer facing up on LED |
| EX6 | 85 | 68 | 65 | 292 | 0.263 | 0.254 | 301 | 0.297 | 0.317 | OC layer facing up on LED |
| COMP EX5 | 64 | | | 289 | 0.296 | 0.315 | | | | Void homogeneously distributed. |
| EX7 | 83 | 72 | 70 | 283 | 0.291 | 0.295 | 301 | 0.307 | 0.322 | OC layer facing up on LED |
| EX8a | 80 | 69 | 65 | 266 | 0.264 | 0.249 | 297 | 0.301 | 0.312 | OC layer facing up on LED |
| EX8b | | 70 | 67 | | | | 296 | 0.294 | 0.302 | OC layer facing up on LED |
| EX8c | | 73 | 68 | | | | 315 | 0.291 | 0.297 | OC layer facing up on LED |
| EX8d | | 71 | 67 | | | | 298 | 0.281 | 0.280 | OC layer facing up on LED |
| COMP EX6 | | 73 | 68 | | | | 312 | 0.282 | 0.281 | Same sample as EX8c. OC layer attached on LED surface. |
| EX9 | 80 | 73 | 69 | 266 | 0.264 | 0.249 | 294 | 0.304 | 0.317 | OC layer facing up on LED |
| EX10 | 80 | 74 | 68 | 266 | 0.264 | 0.249 | 287 | 0.303 | 0.315 | OC layer facing up on LED |
| EX11 | | 72 | 71 | | | | 308 | 0.292 | 0.304 | OC layer facing up on LED |
| EX12 | | 75 | 73 | | | | 305 | 0.288 | 0.298 | OC layer facing up on LED |
| EX13a | | 71 | 67 | | | | 305 | 0.316 | 0.342 | OC layer facing up on LED |
| EX13b | | 69 | 65 | | | | 314 | 0.317 | 0.345 | OC layer facing up on LED |
| EX13c | 80 | 76 | 70 | 276 | 0.274 | 0.266 | 319 | 0.300 | 0.315 | OC layer facing up on LED |
| EX13d | | 71 | 66 | | | | 304 | 0.291 | 0.301 | OC layer facing up on LED |
| EX14 | 80 | 71 | 67 | 276 | 0.274 | 0.266 | 294 | 0.302 | 0.318 | OC layer facing up on LED |
| EX15a | | 69 | 65 | | | | 301 | 0.312 | 0.340 | OC layer facing up on LED |
| EX15b | | 71 | 67 | | | | 310 | 0.304 | 0.327 | OC layer facing up on LED |
| EX15c | 80 | 74 | 68 | 298 | 0.282 | 0.285 | 312 | 0.296 | 0.313 | OC layer facing up on LED |
| EX15d | | 76 | 69 | | | | 329 | 0.288 | 0.300 | OC layer facing up on LED |
| COMP EX7 | | 76 | 69 | | | | 290 | 0.273 | 0.268 | Same sample as EX15d. OC layer attached on LED surface. |
| EX16 | | 71 | 70 | | | | 315 | 0.290 | 0.309 | OC layer facing up on LED |
| EX17 | | 70 | 67 | | | | 302 | 0.285 | 0.299 | OC layer facing up on LED |
| EX18 | 87 | 77 | 72 | 267 | 0.261 | 0.236 | 301 | 0.288 | 0.291 | OC layer facing up on LED |
| COMP EX8 | 87 | 77 | 72 | 267 | 0.261 | 0.236 | 290 | 0.279 | 0.274 | Same sample as EX18. OC layer attached on LED surface. |
| EX19a | 87 | 82 | 75 | 288 | 0.285 | 0.277 | 312 | 0.308 | 0.322 | OC layer facing up on LED |
| EX19b | 85 | 75 | 70 | 285 | 0.281 | 0.280 | 302 | 0.291 | 0.295 | OC layer facing up on LED |
| EX20 | 87 | 82 | 77 | 288 | 0.285 | 0.277 | 304 | 0.297 | 0.304 | OC layer facing up on LED |

Figure 3B:
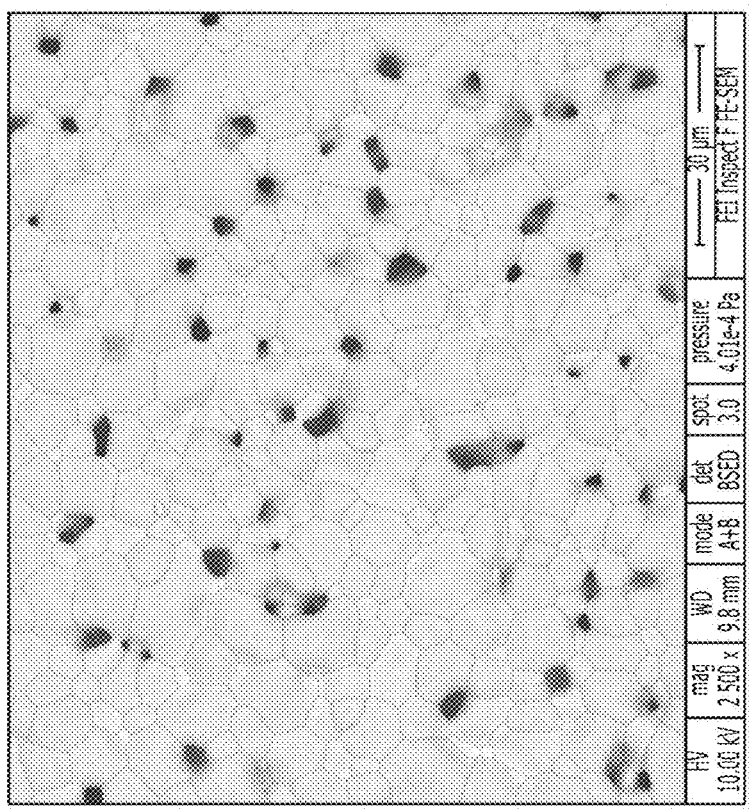
FIGS. 3A and 3B depict scanning electron micrographs of surfaces comprising some embodiments of an emissive element and a light scattering element.
Figure 3A:
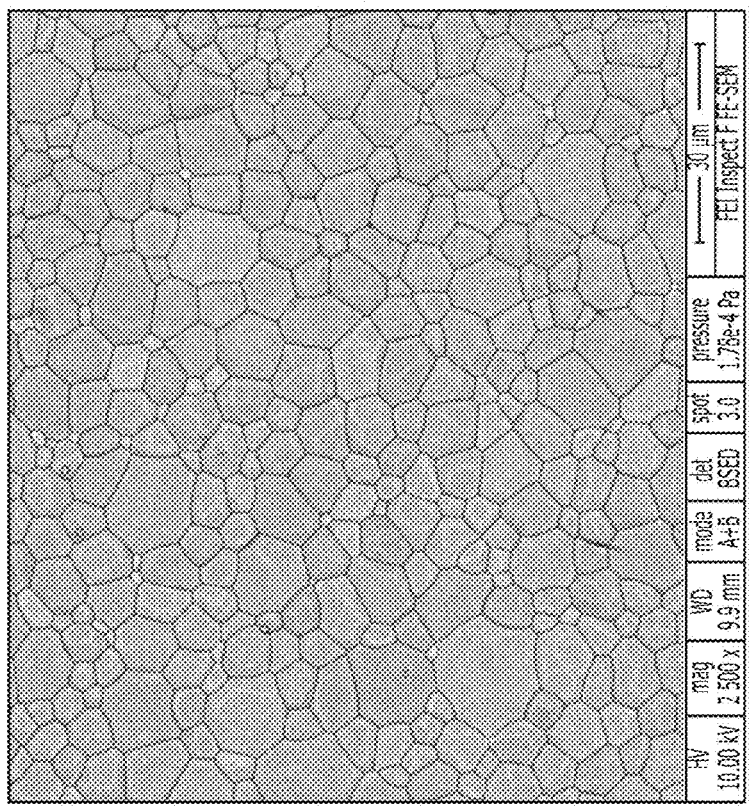
Figure 4:
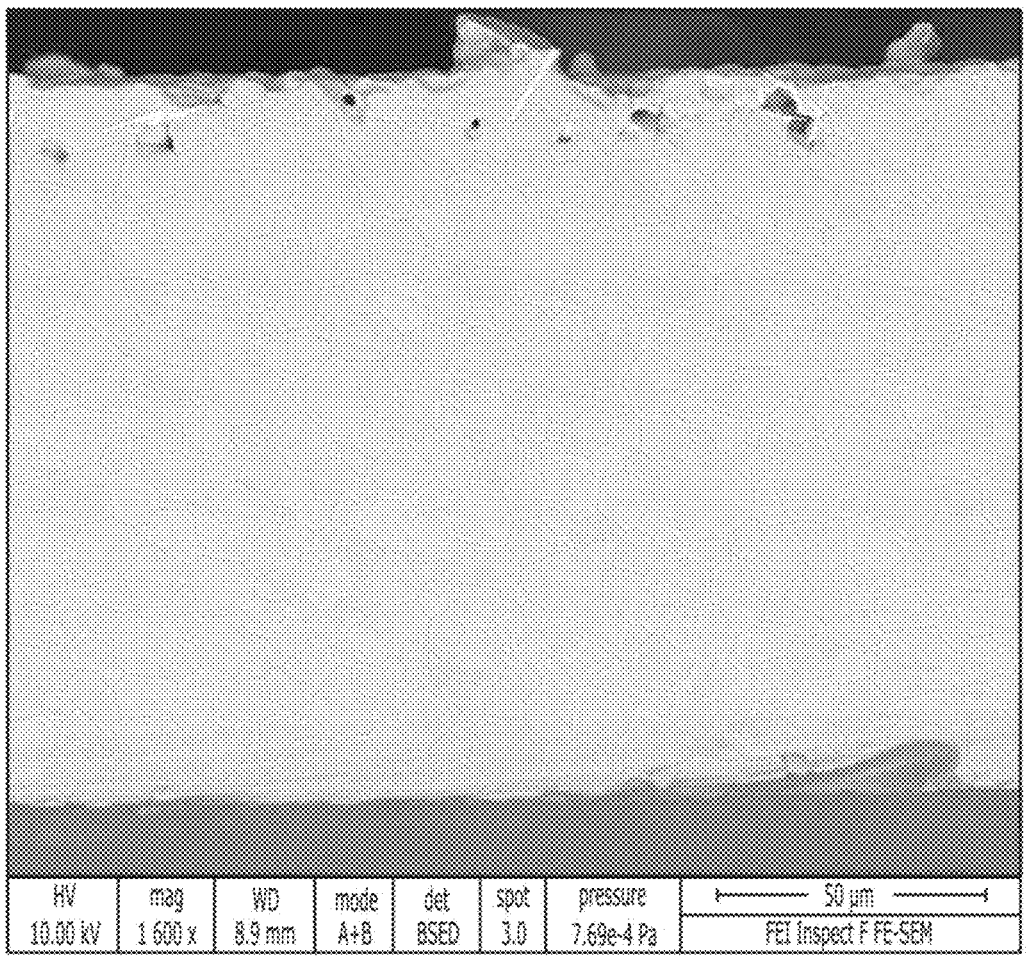
FIG. 4 depicts a cross-sectional scanning electron micrograph of some embodiments of a light scattering element and an emissive element

The surface morphologies of both the emissive layer and the light scattering layer were observed by field emission scanning electron microscopy (FE-SEM). FIG. 3 shows the backscattered electron (BSE)-SEM micrographs of both emissive layer and the light scattering OC layer. These images were collected with an acceleration voltage of 10 kV using FEI Inspect F FE-SEM (Hillsboro, Oreg.). The emissive layer was fully densified as seen in FIG. 3(a), whereas the light scattering layer showed porous structure in FIG. 3(b). Such porosity causes the light scattering for better light out-coupling. It was found by the image analysis in FIG. 3(b) that the porosity of this light scattering layer was approximately 15 vol %. FIG. 4 shows the BSE-SEM micrograph of the cross section of the phosphor ceramic plate which has the light scattering layer on the top surface. Porous structure was observed only near the top surface of the phosphor ceramics in FIG. 4.

Comparative Example 1

The same sample of Example 1b was utilized for this comparative example. The phosphor ceramic sample was placed as the light scattering OC layer attached on the surface of LED; the laminated emissive layer/outcoupling ceramic was placed with the light emissive layer up (emissions from the LED passed up through the emissive layers and through the outcoupling layer). The emissive layers were disposed between the LED/light source and the outcoupling layer. The experimental data are shown in FIG. 2 with the least-squares fit line. Compared with Example 1b, both efficacy and color position decreased when the wrong ceramic surface (the outcoupling layer was disposed between the light source/LED and the emissive layers) was up. It was shown that the emissive layer being disposed between the light scattering OC layer and the LED/light source increases the efficacy and color position while extracting more light from the light emitting phosphor ceramics as compared to when the outcoupling layer is disposed between the LED/light source and the emissive layer[s].

Example 2

A sample in Example 2 was prepared as in Example 1 except that multiple slurries were prepared for different Ce-doping. The summary of the data is shown in Table 5. Regardless of different Ce-doping, it was observed that samples with light scattering OC layer showed both better efficacy and the yellower color position than the reference transparent ceramic sample.

Comparative Example 2

The same sample of Example 2c was utilized for this comparative example. The phosphor ceramic sample was placed as the light scattering OC layer is attached on the surface of LED; the ceramic was placed with the light emissive layer up (emissive layers were disposed between the outcoupling layer and the LED/light source). Compared with Example 2c, both efficacy and color position decreased when the wrong ceramic surface was up (outcoupling layers disposed between the emissive layer[s] and the LED/light source). It was shown that the light scattering OC layer needs to be up to maximize the efficacy and color position while extracting more light from the light emitting phosphor ceramics.

Comparative Example 3

A sample in Comparative example 3 was prepared as in Example 1 except that 42.57 g $Y_2O_3$ particles, 7.62 g $Gd_2O_3$ particles, 35.72 g $Al_2O_3$ particles, 217.0 mg $CeO_2$, 13.50 g aqueous acrylic polymer solution as a main component of polymeric binder for final green sheet, 0.16 g 2,4,7,9-tetramethyl-5-decyne-4,7-diol ethoxylate as a defoamer for aqueous slurry, 1.56 g 2-amino-2-methyl-1 propanol as a plasticizer, and 30.00 g milli-Q water were added to a 8 oz (0.23 L) PP jar, whose inner diameter is 80 mm (Parkway Plastics Inc., Piscataway, N.J.), for aqueous slurry preparation, in order to prepare green sheet leading to 0.30% Ce-doped and 10% Gd-doped transparent YAG phosphor plate. In this example, Ce-doping was increased from 0.25% to 0.3% to adjust color position. In general, Ce-doping and transparency of the phosphor ceramics can be adjusted to obtain the desired color position of the resulting white LED. Three layers of 52 micron thick 0.30% Ce-doped as-cast green sheets were laminated on an anodized aluminum plate without the light scattering OC layer, and this assembly was vacuum-bagged before isostatic pressing. After debinding, the blank plate was sintered at 1825° C. for 20 hrs. It is believed that due to higher sintering temperature and longer sintering time, the voids which appeared to be trapped into the grown grain (scanning electron microscopy images, not shown), which could lead to lower Tt % than fully transparent YAG phosphor plate. Resulting data are summarized in Table 5. It was observed that the color position was at the desired color position near Ccx=0.30. However, the efficacy of this sample without light scattering OC layer on the top was lower than any other samples explained in Example 1 above.

Comparative Example 4

Samples in Comparative example 4 were prepared as in example 2, except that 1.43 g polymeric beads of 6 micron diameter were added to the aqueous slurry solution after the initial ball-milling for 16 hrs, in order to obtain phosphor ceramics with homogeneously distributed voids, instead of applying a light scattering OC layer on the top (see Table 2 and Table 4). In this example, Ce-doping amount was between 0.15% and 0.25% for different color position (see Table 1 and Table 3). For each Ce-doping amount, three layers of 52 micron thick green sheets were laminated on an anodized aluminum plate without the light scattering OC layer, and this assembly was vacuum-bagged before isostatic pressing. After debinding, the blank plate was sintered at 1800° C. for 5 hrs. Resulting data are summarized in Table 5. It was observed that these samples in this comparative example, which do not have the light scattering OC layer on the top, showed slightly lower efficacy than those in Example 2 discussed above at similar color positions.

Example 3

A sample in Example 3 was prepared as in Example 2b except that 1.93 g polymeric beads of 2 micron diameter were added to the aqueous slurry solution after the initial ball-milling for 16 hrs as shown in Table 1. Concurrently another aqueous slurry was prepared for the light scattering layer (OC layer B) based on the slurry formulation shown in Table 2. Then, 40 vol % polymeric beads of a diameter of 4 μm were used for the preparation of OC layer B. After debinding, the blank plate was sintered at 1800° C. for 20 hrs. Resulting data are summarized in Table 5. It was observed that the sample with the OC layer showed yellower color position with better efficacy than that without the OC layer. It should also be noted that this higher efficacy of the sample with the OC layer is also better than that of Comparative example 4b explained above.

Example 4

A sample in Example 4 was prepared as in Example 3 except that a different light scattering layer (OC layer C, see Table 4) was applied to Example 4. Here, 50 vol % polymeric beads of a diameter of 4 µm were used for the preparation of the OC layer C. It was observed that the sample with the OC layer C showed yellower color position with better efficacy than that without the OC layer. It should also be noted that this higher efficacy of the sample with the OC layer is also better than that of Comparative example 4a & 4b explained above.

Example 5

A sample in Example 5 was prepared as in Example 4 except that the Ce-doping was reduced to be 0.20% for the emissive layer and that the sintering condition was 1800° C. for 10 hrs. It was observed that the sample with the OC layer C showed yellower color position with better efficacy than that without the OC layer. It should also be noted that this higher efficacy of the sample with the OC layer is also better than that of Comparative example 4b & 4c explained above.

Example 6

A sample in Example 6 was prepared as in Example 4 except that 57.35 g $Lu_2O_3$ particles, 17.41 g $Gd_2O_3$ particles, 32.75 g $Al_2O_3$ particles, 182 mg $CeO_2$, 15.00 g aqueous acrylic polymer solution as a main component of polymeric binder for final green sheet, 0.14 g 2,4,7,9-tetramethyl-5-decyne-4,7-diol ethoxylate as a defoamer for aqueous slurry, 1.41 g 2-amino-2-methyl-1 propanol as a plasticizer, and 28.33 g milli-Q water were added to a 8 oz (0.23 L) PP jar, whose inner diameter is 80 mm (Parkway Plastics Inc., Piscataway, N.J.), for aqueous slurry preparation, in order to prepare green sheet leading to 0.275% Ce-doped and 25% Gd-doped LuAG phosphor plate. Three layers of 52 micron thick 0.275% Ce-doped and 25% Gd-doped LuAG green sheets were laminated on an anodized aluminium plate with and without the light scattering layer (OC layer A), and this assembly was vacuum-bagged before isostatic pressing. Considering the fact that the refractive indices of YAG and LuAG are almost the same and that the melting points of YAG and LuAG are also almost the same, OC layer A made of YAG was applied to the emissive layers made of LuAG in this example. After debinding, the blank plate was sintered at 1800° C. for 20 hrs. Resulting data are summarized in Table 5. It was observed that the sample with the OC layer showed yellower color position with better efficacy than that without the OC layer.

Comparative Example 5

A sample in Comparative example 5 was prepared as in Example 6 except that three layers of 52 micron thick 0.275% Ce-doped and 25% Gd-doped LuAG green sheets were laminated on an anodized aluminum plate (without the light scattering OC layer) for the CIP press. After debinding, the blank plate was sintered at 1800° C. for 7 hrs, resulting the 64 $T_t$% of the sintered LuAG phosphor ceramics. Resulting data are summarized in Table 5. It was observed that this sample in this comparative example, which do not have the light scattering the OC layer on the top, showed lower efficacy than that with the OC layer in Example 6 discussed above at a similar color position.

Example 7

A sample in Example 7 was prepared as in Example 2 except that the Ce-doping was increased to be 0.40% for the emissive layer. A different light scattering layer (OC layer D) was applied to this Example 7. Here, 30 vol % polymeric beads of a diameter of 4 µm were used for the preparation of the OC layer D. One sample consists of 2 layers of 63 micron thick 0.40% Ce-doped emissive layers, whereas the other consists of a layer of 30 micron thick light scattering layer (OC layer D) on the top of two layers of 63 micron thick 0.40% Ce-doped emissive layers. Both laminates were assembled on an anodized aluminum plate, and this assembly was vacuum-bagged before isostatic pressing. This assembly was laminated using a cold isostatic press (CIP) at 42 MPa at 80° C. for 10 min using an ILS-66 isostatic lamination press (Keko Equipment, Slovenia). As a result, approximately 120 micron (without OC layer)~145 micron (with OC layer) thick green laminates were obtained. The sintering condition was 1800° C. for 10 hrs. Eventually, 0.40% Ce-doped and 10% Gd-doped YAG ceramics with and without light scattering layers were obtained after the end of sintering and re-oxidation. The thickness of the obtained phosphor ceramic plate was in the range of 100~120 micron thick. The summary of the resulting data is shown in Table 5. It was observed that the sample with the OC layer D showed yellower color position with better efficacy than that without the OC layer. It should also be noted that this higher efficacy of the sample with the OC layer is also better than that of Comparative example 4a explained above.

Example 8

Samples in Example 8 were prepared as in Example 7 except that the Ce-doping was changed from 0.20% to 0.35% for the emissive layer. A light scattering layer (OC layer A) was applied to this Example 8. A sample of Example 8d consists of a layer of 63 micron thick 0.20% Ce-doped emissive layers and another layer of 63 micron thick 0.25% Ce-doped emissive layers, and a layer of 30 micron thick light scattering layer (OC layer A) was attached on the top of the layer of 0.25% Ce-doped emissive layers. The sintering condition was 1800° C. for 20 hrs. The summary of the resulting data is shown in Table 5. It was observed that all samples of any Ce-doping with the OC layer A showed yellower color position with better efficacy than that of 0.35% Ce-doping without the OC layer. It should also be noted that this higher efficacy of the samples with the OC layer is also better than that of Comparative example 4 explained above.

Comparative Example 6

The same sample of Example 8c was utilized for this comparative example. The phosphor ceramic sample was placed as the light scattering OC layer and attached on the surface of LED; the ceramic was placed with the light emissive layer up. Compared with Example 8c, both efficacy and color position decreased when the wrong ceramic surface was up. It was shown that the light scattering OC layer needs to be facingup to maximize the efficacy and color position while extracting more light from the light emitting phosphor ceramics.

Example 9

A sample in Example 9 was prepared as in Example 8a except that a different light scattering layer (OC layer E) was applied. Here, 40 vol % polymeric beads of a diameter of 8 µm were used for the preparation of OC layer E. The sintering condition was 1820° C. for 20 hrs. The summary of the resulting data is shown in Table 5. It was observed that the sample with the OC layer E showed a yellower color position with better efficacy than that without the OC layer.

Example 10

A sample in Example 10 was prepared as in Example 8a except that a different light scattering layer (OC layer F) with 0.20% Ce-doping was applied. Here, 40 vol % polymeric beads of a diameter of 8 µm were used for the preparation of OC layer F. The sintering condition was 1820° C. for 20 hrs. The summary of the resulting data is shown in Table 5. It was observed that the sample with OC layer F showed yellower color position with better efficacy than that without the OC layer.

Example 11

A sample in Example 11 was prepared as in Example 8b except that a different light scattering layer (OC layer G) without Gd-doping was applied. Here, 10 vol % polymeric beads of a diameter of 6 µm were used for the preparation of OC layer G. The green sheet of OC layer G was 60 µm thick. The sintering condition was 1830° C. for 10 hrs. The thickness of the portion of OC layer G became approximately 46 µm after the end of sintering. The summary of the resulting data is shown in Table 5. It was observed that the sample with OC layer G showed similar efficacy as Example 8b and 8c with similar color position.

Example 12

A sample in Example 12 was prepared as in Example 8b except that a different light scattering layer (OC layer H) without Gd-doping was applied. Here, 20 vol % polymeric beads of a diameter of 6 µm were used for the preparation of OC layer H. The green sheet of OC layer H was 60 µm thick. The sintering condition was 1845° C. for 10 hrs. The thickness of the portion of OC layer H became approximately 46 µm after the end of sintering. The summary of the resulting data is shown in Table 5. It was observed that the sample with OC layer H showed similar efficacy as Example 8c and 8d with similar color position.

Example 13

Samples in Example 13 were prepared as in Example 8 except that the Gd-doping was reduced to be 7.5%. A light scattering layer (OC layer A) was applied. A sample of Example 13a consists of a layer of 63 micron thick 0.40% Ce-doped emissive layers and another layer of 63 micron thick 0.45% Ce-doped emissive layers, and a layer of 30 micron thick light scattering layer (OC layer A) was attached on the top of the layer of 0.45% Ce-doped emissive layers. The sintering condition was 1830° C. for 20 hrs. The summary of the resulting data is shown in Table 5. It was observed that all samples of any Ce-doping with OC layer A showed yellower color position with better efficacy than that of 0.35% Ce-doping without the OC layer.

Example 14

A sample in Example 14 was prepared as in Example 13 except that the sintering condition was 1800° C. for 20 hrs. The summary of the resulting data is shown in Table 5. It was observed that the samples with OC layer A showed yellower color position with better efficacy than that without the OC layer.

Example 15

Samples in Example 15 were prepared as in Example 13 except that Gd-doping was reduced to be 5.0% and the 8 vol % polymeric beads of 2 µm diameter were added during the aqueous slurry preparation. The summary of the resulting data is shown in Table 5. It was observed that all samples of any Ce-doping with OC layer A showed yellower color position with better efficacy than that of 0.35% Ce-doping without the OC layer.

Comparative Example 7

The same sample of Example 15d was utilized for this Comparative example 7. The phosphor ceramic sample was placed as the light scattering the OC layer is attached on the surface of LED; the ceramic was placed with the light emissive layer up. Compared with Example 15d, both efficacy and color position decreased when the wrong ceramic surface was up. It was shown that the light scattering the OC layer needs to be up to maximize the efficacy and color position while extracting more light from the light emitting phosphor ceramics.

Example 16

A sample in Example 16 was prepared as in Example 15d except that a different light scattering layer (OC layer G) without Gd-doping was applied. Here, 10 vol % polymeric beads of a diameter of 6 µm were used for the preparation of OC layer G. The green sheet of OC layer G was 60 µm thick. The sintering condition was 1830° C. for 10 hrs. The thickness of the portion of OC layer G became approximately 46 µm after the end of sintering. The summary of the resulting data is shown in Table 5. It was observed that the sample with OC layer G showed similar efficacy as Example 15d with similar color position.

Example 17

A sample in Example 17 was prepared as in Example 15d except that a different light scattering layer (OC layer H) without Gd-doping was applied. Here, 20 vol % polymeric beads of a diameter of 6 µm were used for the preparation of OC layer H. The green sheet of OC layer H was 60 µm thick. The sintering condition was 1845° C. for 10 hrs. The thickness of the portion of OC layer H became approximately 46 µm after the end of sintering. The summary of the resulting data is shown in Table 5. It was observed that the sample with OC layer H showed similar efficacy as Example 15d with similar color position.

Example 18

A sample in Example 18 was prepared as in Example 1 except that the sample consists of a layer of 52 micron thick 0.30% Ce-doped emissive layers and another layer of 52 micron thick 0.40% Ce-doped emissive layers, and a layer of 30 micron thick light scattering layer (OC layer A) was attached on the top of the layer of 0.40% Ce-doped emissive layers. Approximately 95 micron (without OC layer)~125 micron (without OC layer) thick green laminates were obtained. The sintering condition was 1800° C. for 10 hrs. Eventually, 0.35% Ce-doped in average and 10% Gd-doped YAG ceramics with and without light scattering OC layer was obtained after the end of sintering and re-oxidation. The thickness of the obtained phosphor ceramic plate was in the range of 80~100 micron thick. The summary of the resulting data is shown in Table 5. It was observed that the sample with OC layer A showed yellower color position with better efficacy than that without the OC layer. It should also be noted that this higher efficacy of the sample with the OC layer is also better than that of Comparative example 4b & 4c explained above.

Comparative Example 8

The same sample of Example 18 was utilized for this Comparative example 8. The phosphor ceramic sample was placed as the light scattering OC layer is attached on the surface of LED; the ceramics was placed with the light emissive layer up. Compared with Example 18, both efficacy and color position decreased when the wrong ceramic surface was up. It was shown that the light scattering OC layer needs to be up to maximize the efficacy and color position while extracting more light from the light emitting phosphor ceramics.

Example 19

Samples in Example 19 were prepared as in Example 18 except that 2 layers of 52 micron thick layers with the same Ce-doping were laminated. The range of Ce-doping was in the range of 0.35%~0.40% in this example. The summary of the resulting data is shown in Table 5. It was observed that the samples with OC layer A showed yellower color position with better efficacy than those without the OC layer. It should also be noted that this higher efficacy of the samples with the OC layer is also better than that of Comparative example 4a & 4b explained above.

Example 20

A sample in Example 20 was prepared as in Example 19 except that a different light scattering layer (OC layer I) with 0.20% Ce-doping was applied to this Example 20. Here, 40 vol % polymeric beads of a diameter of 4 μm were used for the preparation of OC layer I. The summary of the resulting data is shown in Table 5. It was observed that the sample with OC layer I showed yellower color position with better efficacy than that without the OC layer. It should also be noted that this higher efficacy of the sample with the OC layer is also better than that of Comparative example 4a & 4b explained above.

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:
1. A light emitting element comprising:
   an emissive element comprising a host material and an emissive guest material, the emissive element substantially free of light scattering material; and
   a light scattering element comprising either a non-emissive or an emissive material, wherein the light scattering element is between about 2.5% to about 60% by volume voids and the thickness ratio of light scattering element to the emissive element is less than about 1:2;
   wherein the emissive element and the light scattering element have substantially the same refractive index, and the emissive and light scattering elements do not exhibit clear interface between them.
2. The light emitting converting element of claim 1, wherein the emissive element and the light scattering element comprise substantially the same material.

3. The light emitting element of claim 1, wherein the light scattering elements comprise materials substantially concurrently sintered in the same manner as the emissive element.

4. The light emitting element of claim 1, wherein the host material is $Y_3Al_5O_{12}$, $Lu_3Al_5O_{12}$, $Ca_3Sc_2Si_3O_{12}$, $(Y,Tb)_3Al_5O_{12}$, $(Lu, Y, Gd)_3(Al, Ga)_5O_{12}$, $Lu_2CaSi_3Mg_2O_{12}$, or $Lu_2CaAl_4SiO_{12}$.

5. The light emitting element of claim 1, wherein the emissive guest material at least comprises Ce.

6. The light emitting element of claim 5, further comprising an emissive guest material comprising Mn, Nd, Er, Eu, Cr, Yb, Sm, Tb, Gd, or Pr.

7. A semiconductor light emitting device comprising:
a light emitting source providing an emitted radiation; and
a light emitting element of claim 1, wherein the light emitting element is positioned to receive the radiation emitted from the light emitting source.

8. A method of making the ceramic wavelength converting element of claim 1, comprising the steps of
providing an emissive element substantially free of light scattering material;
providing a light scattering element defining 2.5 vol % to about 60 vol % voids therein, the light scattering element less than one-third as thick of the emissive element.

9. The method of claim 8, wherein providing the light scattering element comprises forming a scattering element from a slurry comprising ceramic precursor materials and void creating materials, wherein the void creating material comprise about 2.5 vol % to about 60 vol % of the slurry.

10. The method of claim 8, wherein the emissive element and the light scattering element are substantially concurrently sintered.

11. The method of claim 8, wherein the host material is $(Lu, Y, Gd)_3(Al, Ga)_5O_{12}$.

12. The method of claim 8, wherein the emissive guest material is at least Ce.

13. The method of claim 12, wherein the emissive guest material has a concentration of about 0.05 atomic % to about 10.0 atomic %.

* * * * *

UNITED STATES PATENT AND TRADEMARK OFFICE
CERTIFICATE OF CORRECTION

PATENT NO. : 9,499,740 B2
APPLICATION NO. : 14/548149
DATED : November 22, 2016
INVENTOR(S) : Hiroaki Miyagawa et al.

Page 1 of 1

It is certified that error appears in the above-identified patent and that said Letters Patent is hereby corrected as shown below:

In the Claims

In Column 28, Line 65, "emitting converting element" should read --emitting element--

In Column 29, Lines 18-19, "the ceramic wavelength converting element" should read --the light emitting element--

In Column 30, Line 3, "thick of the" should read --thick as the--

In Column 30, Line 8, "void creating material" should read --void creating materials--

Signed and Sealed this
Fourth Day of April, 2017

Michelle K. Lee
*Director of the United States Patent and Trademark Office*